(12) United States Patent
Zhu et al.

(10) Patent No.: US 9,904,183 B2
(45) Date of Patent: Feb. 27, 2018

(54) COARSE MOTION AND FINE MOTION INTEGRATED RETICLE STAGE DRIVEN BY PLANAR MOTOR

(71) Applicants: TSINGHUA UNIVERSITY, Beijing (CN); BEIJING U-PRECISION TECH CO., LTD., Beijing (CN)

(72) Inventors: Yu Zhu, Beijing (CN); Ming Zhang, Beijing (CN); Fan Zhi, Beijing (CN); Zhao Liu, Beijing (CN); Rong Cheng, Beijing (CN); Kaiming Yang, Beijing (CN); Li Zhang, Beijing (CN); Huichao Qin, Beijing (CN); Yanpo Zhao, Beijing (CN); Li Tian, Beijing (CN); Weinan Ye, Beijing (CN); Jin Zhang, Beijing (CN); Wensheng Yin, Beijing (CN); Haihua Mu, Beijing (CN); Jinchun Hu, Beijing (CN)

(73) Assignees: TSINGHUA UNIVERSITY, Beijing (CN); BEIJING U-PRECISION TECH CO., LTD., Beijing (CN)

( * ) Notice: Subject to any disclaimer, the term of this patent is extended or adjusted under 35 U.S.C. 154(b) by 0 days.

(21) Appl. No.: 15/307,752

(22) PCT Filed: Apr. 17, 2015

(86) PCT No.: PCT/CN2015/076882
§ 371 (c)(1),
(2) Date: Oct. 28, 2016

(87) PCT Pub. No.: WO2015/165336
PCT Pub. Date: Nov. 5, 2015

(65) Prior Publication Data
US 2017/0115580 A1    Apr. 27, 2017

(30) Foreign Application Priority Data

Apr. 28, 2014   (CN) .......................... 2014 1 0175360

(51) Int. Cl.
*G03F 7/20*   (2006.01)

(52) U.S. Cl.
CPC ...... *G03F 7/70716* (2013.01); *G03F 7/70725* (2013.01); *G03F 7/70733* (2013.01);
(Continued)

(58) Field of Classification Search
CPC ............. G03F 7/70725; G03F 7/70766; G03F 7/70775; G03F 7/70716; G03F 7/70758
See application file for complete search history.

(56) References Cited

U.S. PATENT DOCUMENTS

2006/0285092 A1*  12/2006  Ono ..................... G03F 7/70266
                                                                  355/30

FOREIGN PATENT DOCUMENTS

| CN | 1497348 A | 5/2004 |
| CN | 1012221367 A | 7/2008 |

(Continued)

OTHER PUBLICATIONS

International Search Report for International Patent Application No. PCT/CN2015/076882 filed Apr. 17, 2015.

*Primary Examiner* — Michelle M Iacoletti

(57) ABSTRACT

A coarse motion and fine motion integrated reticle stage driven by a planar motor comprises a movable platform (100) of the reticle stage, a balance mass (200), a drive motor, a mask plate (101, 102), a base (001), a vibration isolation system (500), and a measuring system, wherein, the vibration isolation system is located between the balance mass and the base, and the mask plate is mounted on the movable platform. The drive motor of the movable platform is a moving-iron type planar motor (300). The reticle stage can lower the design complexity of the drive motor of the movable platform. Compared with a linear motor, the planar motor can provide push forces in more directions, the (Continued)

number of motors is reduced, the structure of the movable platform is more compact, the inherent frequency and the control bandwidth of the movable platform are improved, and thus control precision is improved.

5 Claims, 4 Drawing Sheets

(52) U.S. Cl.
CPC ...... *G03F 7/70758* (2013.01); *G03F 7/70766* (2013.01); *G03F 7/70775* (2013.01)

(56) References Cited

FOREIGN PATENT DOCUMENTS

| | | |
|---|---|---|
| CN | 101694560 A | 4/2010 |
| CN | 102096338 A | 6/2011 |
| CN | 103105742 A | 5/2013 |
| CN | 103186058 A | 7/2013 |
| CN | 103454864 A | 12/2013 |
| CN | 103926805 A | 7/2014 |
| JP | 2006-040927 A | 2/2006 |

* cited by examiner

US 9,904,183 B2

COARSE MOTION AND FINE MOTION INTEGRATED RETICLE STAGE DRIVEN BY PLANAR MOTOR

CROSS-REFERENCE TO RELATED APPLICATIONS

The present application is a National Stage of International Patent Application No. PCT/CN2015/076882 filed on Apr. 17, 2015, which claims priority to Chinese Patent Application No. 201410175360.5 filed on Apr. 28, 2014, the disclosures of which are hereby incorporated in their entirety by reference.

TECHNICAL FIELD

The present invention relates to a coarse motion and fine motion integrated reticle stage driven by a planar motor, more particularly, to a coarse motion and fine motion integrated reticle stage driven by a moving-iron type planar motor, and the reticle stage is mainly applied to the technical field of semiconductor fabrication.

BACKGROUND ART

The feature size of a large scale integrated circuit is directly determined by a photolithography process, which is one of the key processes in large scale integrated circuit manufacturing. A lithography machine is one of the most important apparatuses in the photolithography process. A projection objective system, an alignment system and a super-precise workpiece stage system are three core technologies in the lithography machine. Wherein, the super-precise workpiece stage system comprises a reticle stage system for supporting mask plates and a silicon wafer stage system for supporting silicon wafers.

The reticle stage system consists of a movable platform of the reticle stage, a balance mass, a drive motor for the movable platform, a mask plate, a base, a vibration isolation system, a measurement system and the like. The exposure process of the lithography machine requires that the drive motor drives the movable platform carrying the mask plate to move to and fro in an "acceleration—uniform velocity—deceleration" movement in a large stroke (>132 mm) along a scanning direction, and to move in a fine motion (±2 mm) with other degrees of freedom. Based on the structures of the movable platforms of the reticle stages, the reticle stages may be divided into two types, i.e., a reticle stage with a movable platform utilizing a coarse motion and fine motion laminated structure, and a reticle stage with a movable platform utilizing a coarse motion and fine motion integrated structure. As for the reticle stage utilizing the coarse motion and fine motion laminated structure, the movable platform of the reticle stage consists of a coarse movable platform which can achieve large stroke movement, and a micropositioner which can achieve high precision fine adjustment. As for the reticle stage utilizing the coarse motion and fine motion integrated structure, the large stroke movement and the high precision fine adjustment are achieved by an individual movable platform of a coarse motion and fine motion integrated reticle stage.

The movable platform utilizing the coarse motion and fine motion integrated structure has features of lighter mass, less cable perturbation and the like, and advantages of less power consumption during the operation of the reticle stage, lower requirement on thrusts of the motors and more accurate theoretical model, some scholars have carried out research on it. In prior art, the six degrees of freedom movement of the movable platform of the coarse motion and fine motion integrated reticle stage is achieved by linear motors, and each of the linear motors may provide a thrust in the movement direction of the mover of the motor and a thrust in a direction perpendicular to the movement direction of the mover of the motor. In order to control the leveling movement and focusing movement of the movable platform of the coarse motion and fine motion integrated reticle stage, at least three linear motors are required to provide the thrusts in the vertical direction. In order to control the six degrees of freedom movement of the movable platform of the coarse motion and fine motion integrated reticle stage, at least another two linear motors are required, which provide thrusts in a different direction from that of the aforementioned linear motors. Due to structural restrictions, the two kinds of motors are different in structure, which increases the design complexity of the drive motors for the movable platform of the coarse motion and fine motion integrated reticle stage. The two kinds of linear motors with different structures are arranged on the movable platform of the coarse motion and fine motion integrated reticle stage in parallel, so that the width of the movable platform of the coarse motion and fine motion integrated reticle stage is increased, and the natural frequency and the control bandwidth of the movable platform of the coarse motion and fine motion integrated reticle stage are reduced, thereby influencing the control precision.

SUMMARY

An objective of the present invention is to provide a magnetically suspended coarse motion and fine motion integrated reticle stage driven by a planar motor, which is aimed at solving the problem of the design complexity of the drive motors for the movable platform of the reticle stage due to the use of linear motors in the prior art, which problem increases the width of the movable platform of the coarse motion and fine motion integrated reticle stage, and reduces the natural frequency and the control bandwidth of the movable platform of the coarse motion and fine motion integrated reticle stage, thereby influencing the control precision.

The technical solutions of the present invention are described below.

The present invention provides a coarse motion and fine motion integrated reticle stage driven by a planar motor, the reticle stage comprises a movable platform of the coarse motion and fine motion integrated reticle stage, a balance mass, a drive motor for the movable platform of the coarse motion and fine motion integrated reticle stage, a mask plate, a base, a vibration isolation system, and a measurement system, wherein, the vibration isolation system is located between the balance mass and the base, and the mask plate is mounted on the movable platform of the coarse motion and fine motion integrated reticle stage, wherein, the drive motor for the movable platform of the coarse motion and fine motion integrated reticle stage is a moving-iron type planar motor, a mover of the moving-iron type planar motor comprises permanent magnet arrays mounted at two sides of the movable platform of the coarse motion and fine motion integrated reticle stage, and a stator of the moving-iron type planar motor comprises coil arrays mounted on the balance mass.

The coarse motion and fine motion integrated reticle stage provided by the present invention further comprises an air floating structure for providing a compensation for a gravity of the movable platform of the coarse motion and fine motion integrated reticle stage, in the air floating structure, an air floating plane is mounted on the movable platform of the coarse motion and fine motion integrated reticle stage, and an air hole mounting structure is mounted on the balance mass.

The coarse motion and fine motion integrated reticle stage provided by the present invention further comprises a magnetic suspension structure for providing a compensation for a gravity of the movable platform of the coarse motion and fine motion integrated reticle stage, wherein, a mover of the magnetic suspension structure is mounted on the movable platform of the coarse motion and fine motion integrated reticle stage, and a stator of the magnetic suspension structure is mounted on the balance mass.

In the coarse motion and fine motion integrated reticle stage provided by the present invention, each of the permanent magnet arrays of the mover of the planar motor is arranged in a two-dimension Halbach array, and coils of the coil arrays of the stator of the planar motor are arranged in two directions, i.e., in Y direction and Z direction.

The coarse motion and fine motion integrated reticle stage provided by the present invention utilizes a transmission-type mask plate, the movable platform of the coarse motion and fine motion integrated reticle stage has a hollow structure, and the mask plate is arranged in a hollow portion of the movable platform of the coarse motion and fine motion integrated reticle stage.

The coarse motion and fine motion integrated reticle stage provided by the present invention utilizes a reflection-type mask plate, the movable platform of the coarse motion and fine motion integrated reticle stage has a solid structure, and the mask plate is arranged at a bottom of the movable platform of the coarse motion and fine motion integrated reticle stage.

Compared with the prior art, the present invention has the following advantages and prominent technical effects: the coarse motion and fine motion integrated reticle stage provided by the present invention achieves the six degrees of freedom movement of the movable platform of the coarse motion and fine motion integrated reticle stage by using a moving-iron type planar motor with a single structure, which can reduce the design complexity of the motors for the movable platform of the coarse motion and fine motion integrated reticle stage effectively; compared with a linear motor, the planar motor can provide thrusts in more directions, so that the number of the motors is reduced, the structure of the movable platform of the coarse motion and fine motion integrated reticle stage is more compact, and the natural frequency and the control bandwidth of the movable platform of the coarse motion and fine motion integrated reticle stage are improved, and thus the control precision is improved.

BRIEF DESCRIPTION OF THE DRAWINGS

FIG. 5b is a section view taken along line A-A in FIG. 5a.

FIG. 6b is a section view taken along line B-B in FIG. 6a.

Figure 1:
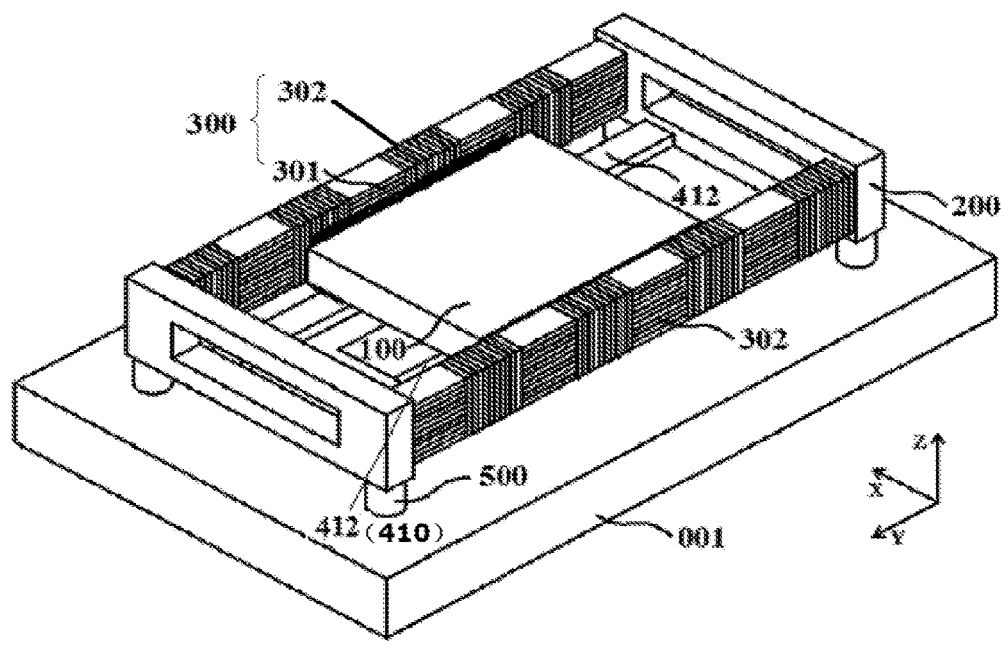
FIG. 1 is a diagram illustrating the structure of the coarse motion and fine motion integrated reticle stage driven by the planar motor provided by the present invention.

In the drawings: 100—movable platform of the coarse motion and fine motion integrated reticle stage, 101—transmission-type mask plate, 102—reflection-type mask plate, 200—balance mass, 300—moving-iron type planar motor, 301—mover of the moving-iron type planar motor, 302—stator of the moving-iron type planar motor, 410—air floating structure, 412—air hole mounting structure, 420—magnetic suspension structure, 422—stator of the magnetic suspension structure, 500—vibration isolation system.

DETAILED DESCRIPTION OF EMBODIMENTS

Hereinafter, the structure, principle and implementation of the present invention are further explained in detail in connection with the accompanying drawings.

Figure 2:
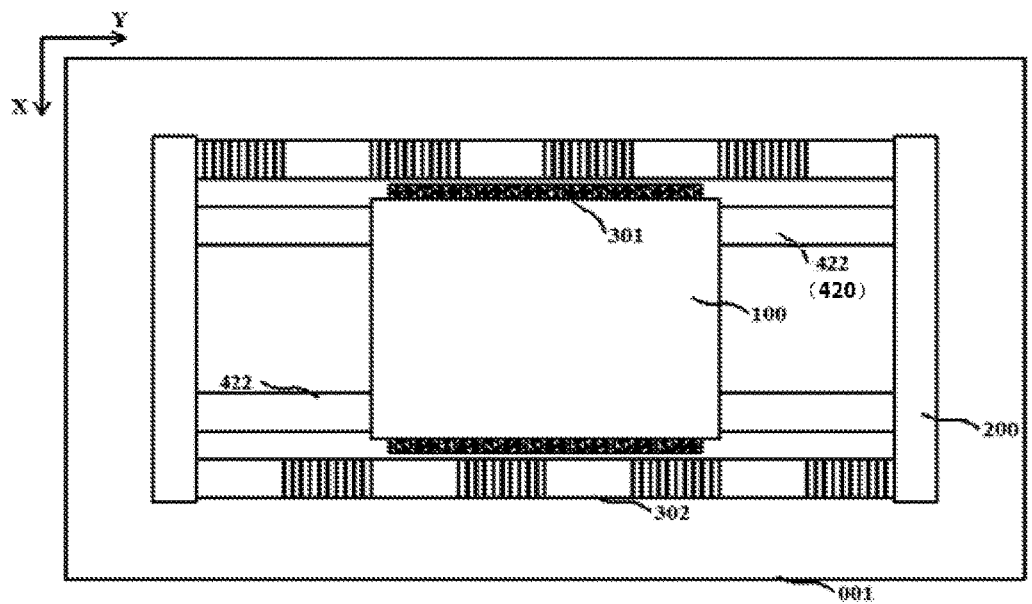
FIG. 2 is a top view illustrating the structure of the coarse motion and fine motion integrated reticle stage driven by the planar motor provided by the present invention.

FIG. 1 and FIg. 2 are an isometric view and a top view illustrating the structure of the coarse motion and fine motion integrated reticle stage driven by the planar motor provided by the present invention, respectively. The coarse motion and fine motion integrated reticle stage driven by the planar motor comprises a movable platform 100 of the coarse motion and fine motion integrated reticle stage, a balance mass 200, a drive motor for the movable platform of the coarse motion and fine motion integrated reticle stage, a mask plate, a base 001, a vibration isolation system 500 and a measurement system. The vibration isolation system 500 is located between the balance mass and the base, and the mask plate is mounted on the movable platform of the coarse motion and fine motion integrated reticle stage. The drive motor for the movable platform of the coarse motion and fine motion integrated reticle stage employs a moving-iron type planar motor 300, a mover 301 of the moving-iron type planar motor comprises permanent magnet arrays mounted at two sides of the movable platform 100 of the coarse motion and fine motion integrated reticle stage, and a stator 302 of the moving-iron type planar motor comprises coil arrays mounted on the balance mass 200. The six degrees of freedom movement (a large stroke movement in Y direction, and other five degrees of freedom fine adjustment of the movable platform of the coarse motion and fine motion integrated reticle stage) of the movable platform 100 of the coarse motion and fine motion integrated reticle stage is achieved by the planar motor 300 (permanent magnet arrays) provided at the two sides of the movable platform 100 of the coarse motion and fine motion integrated reticle stage.

When the movable platform 100 of the coarse motion and fine motion integrated reticle stage is supported in an air floating way, the vertical force provided by the air floating structure 410 compensates the gravity of the movable platform 100 of the coarse motion and fine motion integrated reticle stage. When the movable platform 100 of the coarse motion and fine motion integrated reticle stage is supported in a magnetic suspension way, the vertical force provided by the magnetic suspension structure 420 compensates the gravity of the movable platform 100 of the coarse motion and fine motion integrated reticle stage.

The air floating plane of the air floating structure 410 is mounted on the movable platform 100 of the coarse motion and fine motion integrated reticle stage, and the air hole mounting structure 412 is mounted on the balance mass 200.

The mover of the magnetic suspension structure is mounted on the movable platform 100 of the coarse motion and fine motion integrated reticle stage, and the stator 422 of the magnetic suspension structure is mounted on the balance mass 200, wherein, when the stator 422 of the magnetic suspension structure is arranged above the movable platform 100 of the coarse motion and fine motion integrated reticle stage, the stator provides a vertical upward attraction for the movable platform 100 of the coarse motion and fine motion integrated reticle stage; when the stator 422 of the magnetic suspension structure is arranged below the movable platform 100 of the coarse motion and fine motion integrated reticle stage, the stator provides a vertical upward repulsion; and when the stators 422 of the magnetic suspension structure are arranged above and below the movable platform 100 of the coarse motion and fine motion integrated reticle stage respectively, the stators provide a vertical upward resultant force.

Figure 3:
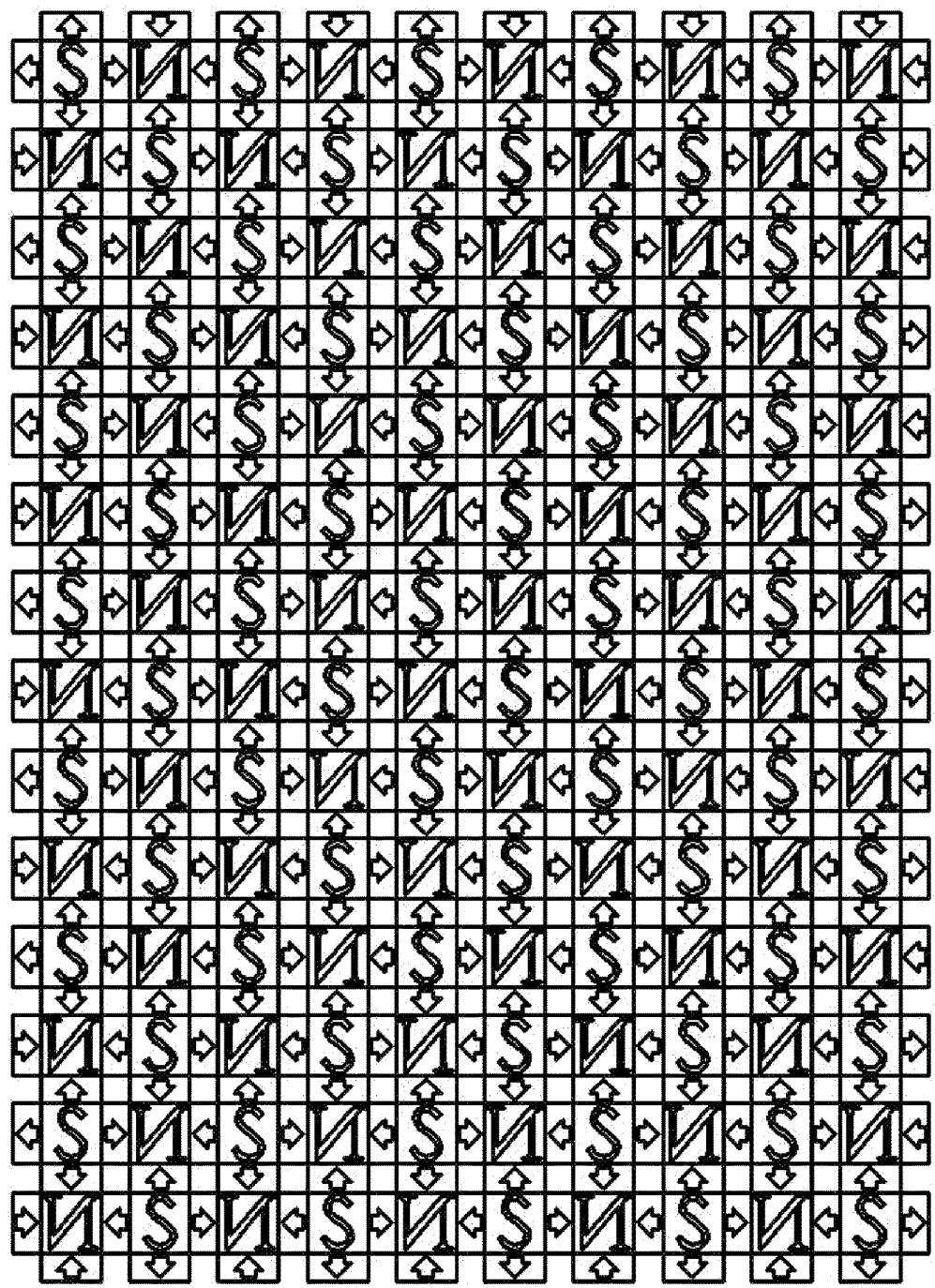
FIG. 3 is a diagram illustrating the arrangement of the permanent magnet array of the mover of the moving-iron type planar motor of the present invention.

FIG. 3 shows the mover 301 of the moving-iron type planar motor of the present invention, and the mover comprises permanent magnet arrays mounted on the movable platform 100 of the coarse motion and fine motion integrated reticle stage, wherein, the permanent magnet array is arranged in a two-dimension Halbach array.

Figure 4:
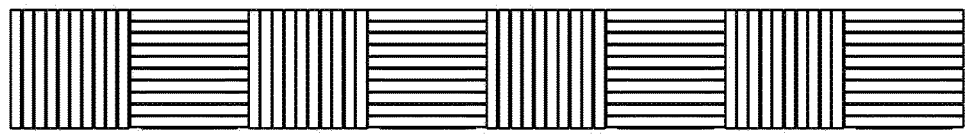
FIG. 4 is a diagram illustrating the arrangement of the coil array of the stator of the moving-iron type planar motor of the present invention.

FIG. 4 shows the stator 302 of the moving-iron type planar motor of the present invention, and the stator comprises coil arrays mounted on the balance mass 200, wherein, the coils of the coil arrays are arranged in two directions, i.e., in Y direction and X direction.

Figure 5A:
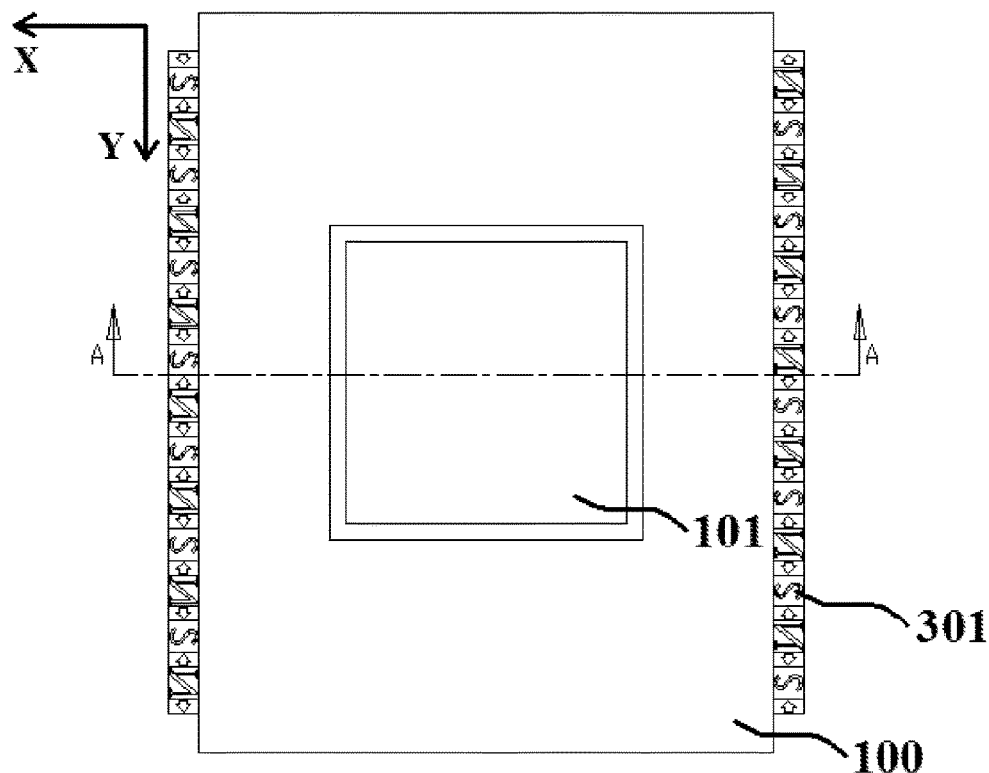
FIG. 5a is a top view illustrating the structure of the movable platform of the coarse motion and fine motion integrated reticle stage driven by the planar motor, when the present invention is applied to a deep ultraviolet (DUV) lithography machine.
Figure 5B:
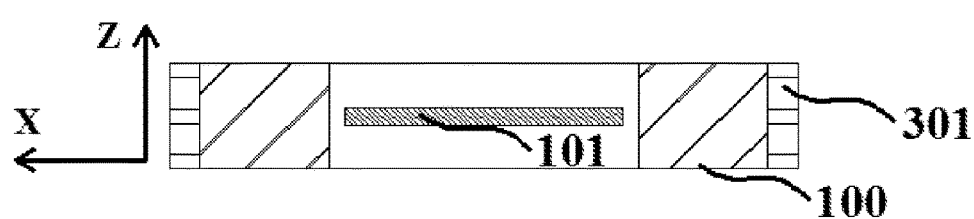

FIG. 5a is a top view illustrating the structure of the movable platform 100 of the coarse motion and fine motion integrated reticle stage driven by the planar motor, when the present invention is applied to an deep ultraviolet (DUV) lithography machine, and FIG. 5b is a section view taken along line A-A in FIG. 5a. The coarse motion and fine motion integrated reticle stage 100 utilizes a transmission-type mask plate 101, the movable platform 100 of the coarse motion and fine motion integrated reticle stage has a hollow structure, and the mask plate is arranged in the hollow portion of the movable platform 100 of the coarse motion and fine motion integrated reticle stage.

Figure 6A:
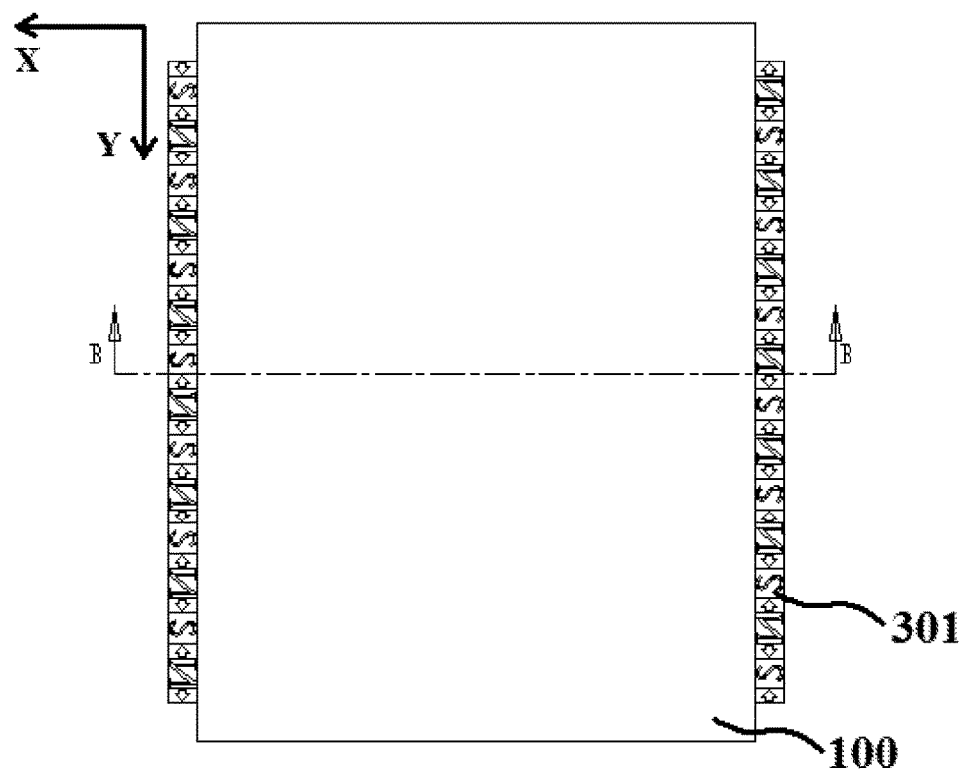
FIG. 6a is a top view illustrating the structure of the movable platform of the coarse motion and fine motion integrated reticle stage driven by the planar motor, when the present invention is applied to an extreme ultraviolet (EUV) lithography machine.
Figure 6B:
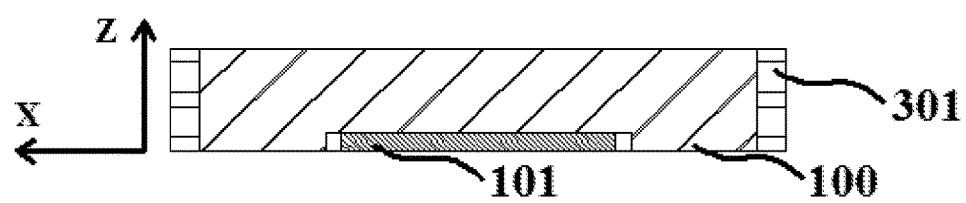

FIG. 6a is a top view illustrating the structure of the movable platform 100 of the coarse motion and fine motion integrated reticle stage driven by the planar motor, when the present invention is applied to an extreme ultraviolet (EUV) lithography machine, and FIG. 6b is a section view taken along line B-B in FIG. 6a. The coarse motion and fine motion integrated reticle stage 100 utilizes a reflection-type mask plate 102, the movable platform 100 of the coarse motion and fine motion integrated reticle stage has a solid structure, and the mask plate is arranged at the bottom of the movable platform 100 of the coarse motion and fine motion integrated reticle stage.

The invention claimed is:

1. A coarse motion and fine motion integrated reticle stage driven by a planar motor, comprising: a movable platform of the coarse motion and fine motion integrated reticle stage, a balance mass, a drive motor for the movable platform of the coarse motion and fine motion integrated reticle stage, a mask plate, a base, a vibration isolation system, and a measurement system,
   wherein the vibration isolation system is located between the balance mass and the base, and the mask plate is mounted on the movable platform of the coarse motion and fine motion integrated reticle stage,
   wherein the drive motor for the movable platform of the coarse motion and fine motion integrated reticle stage is a moving-iron type planar motor,
   wherein a mover of the moving-iron type planar motor comprises permanent magnet arrays mounted at two sides of the movable platform of the coarse motion and fine motion integrated reticle stage, and a stator of the moving-iron type planar motor comprises coil arrays mounted on the balance mass,
   wherein the coarse motion and fine motion integrated reticle stage further comprises an air floating structure compensating for a gravity of the movable platform of the coarse motion and fine motion integrated reticle stage, and
   wherein, in the air floating structure, an air floating plane is mounted on the movable platform of the coarse motion and fine motion integrated reticle stage, and an air hole mounting structure is mounted on the balance mass.

2. The coarse motion and fine motion integrated reticle stage according to claim 1, wherein the coarse motion and fine motion integrated reticle stage further comprises a magnetic suspension structure compensating for a gravity of the movable platform of the coarse motion and fine motion integrated reticle stage, and
   wherein a mover of the magnetic suspension structure is mounted on the movable platform of the coarse motion and fine motion integrated reticle stage, and a stator of the magnetic suspension structure is mounted on the balance mass.

3. The coarse motion and fine motion integrated reticle stage according to claim 1, wherein each of the permanent magnet arrays of the mover of the planar motor is arranged in a two dimensional Halbach array, and
   wherein coils of the coil arrays of the stator of the planar motor are arranged in two directions, i.e., in Y direction and Z direction.

4. The coarse motion and fine motion integrated reticle stage according to claim 1, wherein the mask plate of the coarse motion and fine motion integrated reticle stage employs a transmission-type mask plate,
   wherein the movable platform of the coarse motion and fine motion integrated reticle stage has a hollow structure, and
   wherein the mask plate is arranged in a hollow portion of the movable platform of the coarse motion and fine motion integrated reticle stage.

5. The coarse motion and fine motion integrated reticle stage according to claim 1, wherein the mask plate of the coarse motion and fine motion integrated reticle stage employs a reflection-type mask plate, and
   wherein the movable platform of the coarse motion and fine motion integrated reticle stage has a solid structure, and
   wherein the mask plate is arranged at a bottom of the movable platform of the coarse motion and fine motion integrated reticle stage.

\* \* \* \* \*